United States Patent
Sakamoto et al.

(10) Patent No.: US 10,137,526 B2
(45) Date of Patent: Nov. 27, 2018

(54) LASER MACHINING DEVICE

(71) Applicant: SHIMADZU CORPORATION, Nishinokyo-Kuwabaracho, Nakagyo-Ku, Kyoto-Shi Kyoto (JP)

(72) Inventors: Junki Sakamoto, Kyoto (JP); Ichiro Fukushi, Kyoto (JP); Aklyuki Kadoya, Kyoto (JP); Kazuma Watanabe, Kyoto (JP); Jiro Saikawa, Kyoto (JP); Naoya Ishigaki, Kyoto (JP); Shingo Uno, Kyoto (JP); Tomoyuki Hiroki, Kyoto (JP); Koji Tojo, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 338 days.

(21) Appl. No.: 15/123,904

(22) PCT Filed: Mar. 11, 2014

(86) PCT No.: PCT/JP2014/056279
§ 371 (c)(1),
(2) Date: Sep. 6, 2016

(87) PCT Pub. No.: WO2015/136615
PCT Pub. Date: Sep. 17, 2015

(65) Prior Publication Data
US 2017/0021449 A1    Jan. 26, 2017

(51) Int. Cl.
*B23K 26/042*    (2014.01)
*H01S 5/40*      (2006.01)
(Continued)

(52) U.S. Cl.
CPC ............ *B23K 26/042* (2015.10); *B23K 26/03* (2013.01); *B23K 26/04* (2013.01); *H01S 5/042* (2013.01);
(Continued)

(58) Field of Classification Search
CPC .............. B23K 26/04; H01S 5/40; H01S 5/04
(Continued)

(56) References Cited

U.S. PATENT DOCUMENTS

| 3,464,534 A * | 9/1969 | Muncheryan ......... B08B 7/0042 |
| | | 15/3.53 |
| 5,705,788 A * | 1/1998 | Beyer ..................... B23K 26/03 |
| | | 148/512 |

(Continued)

FOREIGN PATENT DOCUMENTS

| JP | 2003/0016711 | 1/2003 |
| JP | 2006-272416 | 10/2006 |

(Continued)

OTHER PUBLICATIONS

PCT/JP2014/056279, International Search Report dated May 30, 2014, 1 page—English, 2 pages—Japanese.

*Primary Examiner* — Samuel M Heinrich
(74) *Attorney, Agent, or Firm* — Andrew F. Young, Esq.; Lackenbach Siegel, LLP

(57) ABSTRACT

A laser machining device machines a machining target subject by irradiating the converged laser beam output from each laser diode of a plurality of laser diodes connected in series to each other. A machining laser beam output-power driving circuit Q1 outputs a machining laser beam by driving the plurality of laser diodes 11a-11 d, 13. A guide light output-power driving circuit Q2 outputs a guide light by driving a partial laser diode 13 of the plurality of laser diodes. A selection means SW1, SW2 selects the guide light output-power driving circuit on determining the position and selects the machining laser output-power driving circuit on a laser machining. A setup value comparison circuit 16 controls the electric current flowing through the part of laser diodes to be below the electric current setup value to output (Continued)

the guide light having electric current not higher than the predetermined value.

4 Claims, 2 Drawing Sheets

(51) Int. Cl.
    *H01S 5/042*      (2006.01)
    *B23K 26/04*      (2014.01)
    *B23K 26/03*      (2006.01)
    *H01S 5/068*      (2006.01)

(52) U.S. Cl.
    CPC ........ *H01S 5/4025* (2013.01); *H01S 5/06825* (2013.01); *H01S 5/4012* (2013.01)

(58) Field of Classification Search
    USPC ........................................ 219/121.61, 121.68
    See application file for complete search history.

(56) References Cited

U.S. PATENT DOCUMENTS

| | | | |
|---|---|---|---|
| 5,886,313 A * | 3/1999 | Krause | B23K 26/034 |
| | | | 219/121.6 |
| 6,444,947 B1 * | 9/2002 | Bonss | B23K 26/0604 |
| | | | 219/121.63 |
| 2003/0016711 A1 | 1/2003 | Crawford | |

FOREIGN PATENT DOCUMENTS

| | | |
|---|---|---|
| JP | 2008-155246 | 7/2008 |
| JP | 2012-114338 | 6/2012 |

* cited by examiner

LASER MACHINING DEVICE

CROSS REFERENCE TO RELATED APPLICATIONS

This application relates to and claims priority from PCT Ser. No. PCT/JP2014/056279 filed Mar. 11, 2014, the entire contents of which are incorporated herein by reference.

FIGURE SELECTED FOR PUBLICATION

FIG. 1

BACKGROUND OF THE INVENTION

Field of the Invention

The present invention relates to a laser machining device and particularly relates to a laser machining device capable of stably emitting a guide light of semiconductor laser.

Description of the Related Art

An output-power of the beam radiated from single diode is small.

Accordingly, relative to a laser machining using a direct diode laser, a plurality of beams is input into an optical fiber using an optical element and the laser output-power is provided through the optical fiber.

In addition, relative to the laser machining device using non-visible machining laser beam, if the guide light is installed, the optical system and the size of the laser device must be large. For example, in the laser machining device disclosed in the Patent Document 1, a dichroic mirror and a half mirror are in-place in the dead space between lens of beam expander structure of the machining laser beam, and the optical axes of the machining laser beam and the guide light are aligned. In such way, the positions of the machining laser beam and the guide light are aligned.

However, a deviation relative to the focal positions of the machining laser beam and the guide light takes place so that the accuracy thereof can be poor unless a mechanism to correct the focal distances is available. Further, a laser diode of optical system or visible light must be installed for the guide light.

In addition, a blue laser diode, which is a visible light, having a high output-power is developed so that the blue laser diode can be now applied as a light source of the direct diode laser. The direct diode laser is using the visible laser diode so that an optical element for the guide light can be shared with the machining laser beam.

PRIOR ART DOCUMENTS

Patent Documents

JP 2006-272416 A

ASPECTS AND SUMMARY OF THE INVENTION

Problems to be Solved by the Invention

However, when a machining laser beam and a guide light are shared, it has been difficult to constantly keep a light output-power at a weak output-power of 1 mW (class 2.)

The below described is for such a reason. Generally, a plurality of laser diodes is connected in tandem to suppress heat generation relative to the electric current control element and just one electric current control element has been controlling the machining laser beam. Nevertheless, when the driving electric current slightly increases due to any kind of noises, the output-power may increase significantly.

A purpose of the present invention is to provide a laser machining device that can drive stably the guide light with a low output-power when specified during positioning and can drive with a significantly high output-power on laser machining in the system in which a plurality of laser diodes is connected in tandem.

Means for Solving the Problem

To solve the above problems, a laser machining device of the present invention that is the laser machining device to machine a machining target subject by irradiating the converged laser beams output from each laser diode of the plurality of laser diodes connected in series comprises; a machining laser beam output-power driving circuit that outputs a machining laser beam by driving the plurality of laser diodes; a guide light output-power driving circuit that output a guide light by driving a partial laser diode of the plurality of laser diodes; a selection means to select the guide light output-power driving circuit on determining the position and to select the machining laser beam output driving circuit on laser machining; and a setup value comparison circuit to control the electric current so as to be below the electric current setup value to output the guide light, wherein the electric current flows through the partial laser diode is lower than the predetermined value.

Effect of the Invention

According to the present invention; a selection means selects the guide light output-power driving circuit on determining the position and selects the machining laser beam output-power driving circuit on the laser machining, and a set value comparison circuit controls the electric current so as to be below the electric current setup value to output the guide light, in which the electric current flowing through the partial laser diode is lower than the predetermined value; so that a laser machining device that can drive stably the guide light with a low output-power on determining the position and can drive with a significantly high output-power on laser machining can be provided.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
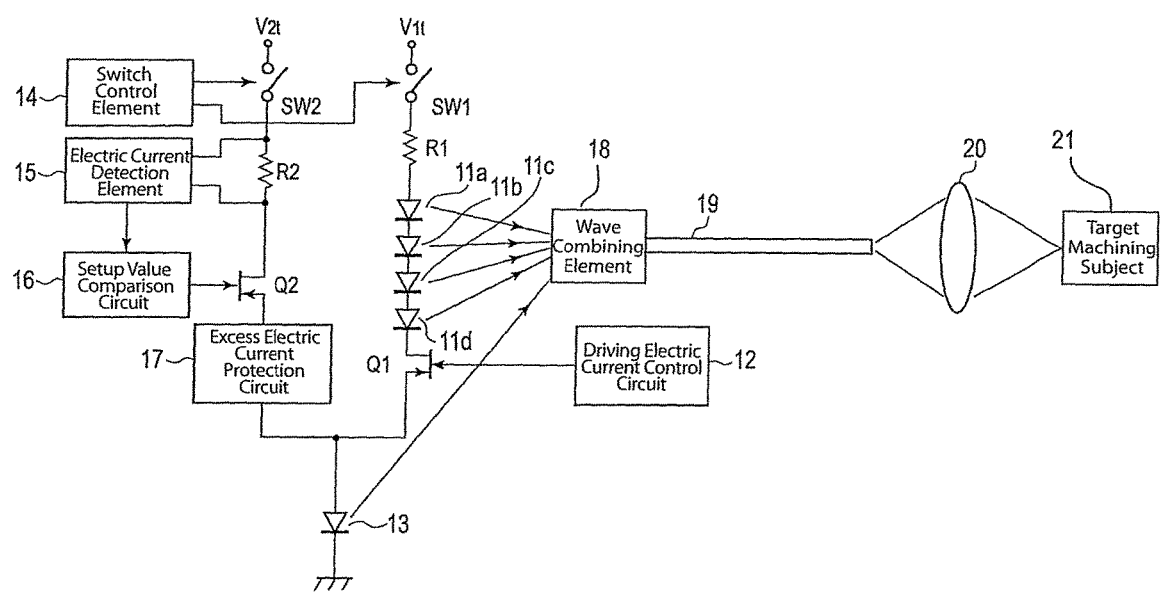
FIG. 1 is a schematic diagram illustrating the structure of a laser machining device according to the aspect of the Embodiment 1 of the present invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Hereinafter, referring to FIGs., the inventor sets forth further detail of a laser machining device according to the aspect of the Embodiment of the present invention. The present invention is characterized by that the laser machining device that can drive stably the guide light with a low output-power, e.g., at most 1 mW, on determining the position; and can drive with a significantly high output-power, e.g., at least 10 W, on laser machining, in the system in which a plurality of laser diodes are connected in series with each other; can be provided.

The Aspect of the Embodiment 1

Referring to FIG. 1, a laser machining device according to the aspect of the Embodiment of the present invention machines a machining target subject 21 by irradiating the laser beam that is output from each laser diode of the plurality of laser diodes 11a-11d, 13 connected in series and then converged in a wave combining element 18. The laser beam converged in the wave synthesis element 18 passes through optical fibers 19 and further converged by a convergence lens 20 is irradiated to the machining target subject 21. The plurality of laser diodes 11a-11d, 13 is applied to a laser machining of the machining target subject 21.

A power source V1*t* is connected to the anode of the laser diode 11a via a resistance R1 and a switch SW1 (first switch.) A drain of N-type MOSFETQ1 (metal-oxide-semiconductor field-effect transistor Q1) comprising the first electric current control element is connected to the cathode of the laser diode 11d and an anode of the laser diode 13 is connected to the source of MOSFETQ1.

A driving electric current control circuit 12 stores the setup electric current value needed to obtain the output-power for machining. The driving electric current control circuit 12 adds the control signal to the gate of MOSFETQ1 and flows the electric current indicated by the necessary setup electric current value to provide a plurality of laser diodes 11a-11d, 13 with the output-power for machining so that a laser beam out of the plurality of laser diodes 11a-11d, 13 can be output.

MOSFETQ1 and the driving electric current control circuit 12 correspond to the machining laser beam output-power driving circuit of the present invention, which outputs the machining laser beam by driving all laser diodes of the plurality of laser diodes 11a-11d, 13 being connected in series.

The cathode of the laser diode 13 is grounded. The laser diode 13 can be also applied as a guide light to determine the position.

The anode of the laser diode 13 is connected to a source of N-type MOSFETQ2 comprising the second electric current control element via an excess electric current protection circuit 17. A drain of MOSFETQ2 is connected to a power source V2*t* via a resistance R2 and a switch SW2 (second switch.)

A switch control element 14 turns the switch SW2 on when determining the position of the laser head and turns the SW1 on when conducting a laser machining. The SW1, the SW2 and the switch control element 14 are corresponding to the selection means of the present invention.

An electric current detection element 15 detects the electric current flowing through the resistance R2 when the switch SW2 is on and outputs the detected electric current to a setup value comparison circuit 16.

The setup value comparison circuit 16 stores the electric current setup value to output the guide light below the predetermined value (e.g., 1 mW) and also inputs the electric current out of the electric current detection element 15.

The setup value comparison circuit 16 controls the electric current out of the electric current detection element 15 so as to be below the electric current setup value stored inside by adding the control signal to the gate of MOSFETQ2. MOSFETQ2 and the driving electric current control circuit 16 correspond to the guide light output-power driving circuit of the present invention, which outputs the guide light by driving the laser diode 13.

Further, according to the aspect of the present Embodiment 1, only the laser diode 13 is for the guide light but more than 2 laser diodes can be connected in series for the guide light.

An excess electric current protection circuit 17 controls the electric current flowing through the laser diode 13 so as to be below the upper limit of the electric current.

Next, the inventor illustrates an operation of the laser machining device structured according to the aspect of the Embodiment 1. First, the switch control element 14 turns the switch SW2 on when determining the position. Accordingly, the electric current flows in the pass from the electric power source V2*t*, the switch Sw2, the resistance R2, MOSFETQ2, the excess electric current protection circuit 17 and the laser diode 13 in order. The laser beam output from the laser diode 13 can be applied as a guide light.

At this time, the output-power may vary depending on the laser's temperature and deterioration or failure of a part of laser diodes being used. Generally, in the case of a rising of a laser element's temperature and a gradual deterioration or failure of the laser element, a setup value of the required electric current tends to become a large number.

Accordingly, the electric current detection element 15 detects the electric current flowing through the laser diode 13 and then the setup value comparison circuit 16 controls the electric current out of the electric current detection element 15 so as to be below the electric current setup value stored inside by adding the control signal to the gate of MOSFETQ2 so as to suppress the output-power P below 1 mW. Therefore, the output-power P can be suppressed below 1 mW.

In addition, an excess electric current protection circuit 17 controls the electric current flowing through the laser diode 13 so as to be below the upper limit of the electric current so that an occurrence of the flow of an excess electric current can be prevented.

Next, the switch control element 14 turns the switch SW1 when the laser machining. At this time, the electric current flows in order from the electric power source V1t to the switch SW1, the resistance R1, the laser diodes 11a-11d, MOSFETQ1 and the laser diode 13. The laser beam is combined with the laser diodes 11a-11d, 13 so that the output-power of 10 W can be provided on the laser machining.

Accordingly, according to the laser machining device of the present Embodiment 1, the driving system on the guide and the driving system on the machining are separately installed so that a guide light output-power below 1 mW can be obtained and the operator can be protected from being exposed to the strong laser beam, precautionarily.

In addition, the position can be determined by the naked eye so that the adjustment of the laser head can be facilitated and a workability therefore can be improved. In addition, the guide light and the machining laser beam are radiated from the same light source and have the same optical axis so that the optical parts such as the number of mirrors, lenses and so forth can be reduced and a small size laser device can be provided, accordingly.

The Aspect of the Embodiment 2

Figure 2:
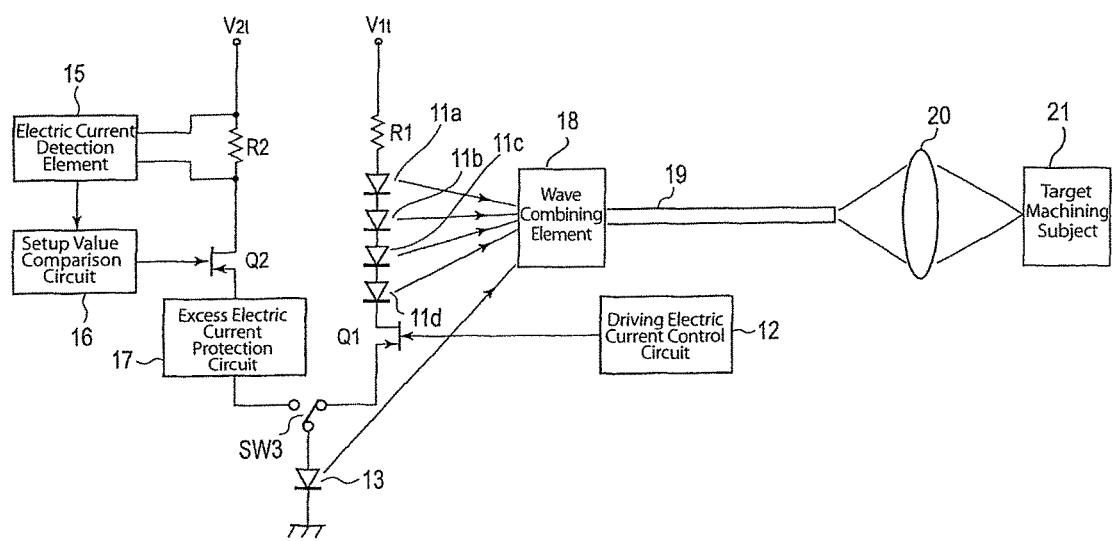
FIG. 2 is a schematic diagram illustrating the structure of a laser machining device according to the aspect of the Embodiment 2 of the present invention.

FIG. 2 is a diagram illustrating the structure of a laser machining device according to the aspect of the Embodiment 2 of the present invention. Referring to FIG. 2, the laser machining device according to the aspect of the Embodiment 2 does not have the SW1, SW2 in the structure of the laser machining device according to the aspect of the Embodiment 1 referring to FIG. 1, is connected to the anode of the laser diode 13, selects the guide light output-power driving circuit including the MOSFETQ2 on determining the position, and includes a switch SW3 (a third switch) that selects the machining laser beam output-power driving circuit including MOSFETS1 on a laser machining.

According to such structure, the switch SW3 is connected to the side of an excess electric current protection circuit 17 on determining the position. Accordingly, when the MOSFETQ2 is turned on, an electric current flows through only the laser diode 13 so that the laser beam for a guide can be obtained.

On the other hand, the switch SW3 is connected to the side of the MOSFETQ1 on a laser machining. Accordingly, when the MOSFETQ1 is turned on, an electric current flows through the laser diodes 11a-11d, 13 so that the laser beam can be obtained.

Accordingly, relative to the laser machining device according to the aspect of the Embodiment 2, the same effect as the effect based on the laser machining device according to the aspect of the Embodiment 1 can be obtained.

Further, the invention may not be limited to the laser machining device relative to the above aspect of the Embodiments. Relative to the laser machining device according to the aspect of the Embodiment 1, the switch SW1 and the switch SW2 are operative as complementarily on-and-off, but for example, the switch SW1 and the switch SW2 can be both off. Or the machining laser beam output-power driving circuit can be turned on only if the safety is assured.

According to the Embodiments, all laser diodes are driven, but all laser diodes should not be always driven together and one or a few diodes of the plurality of laser diodes can be left undriven.

INDUSTRIAL APPLICABILITY

The present invention is applicable to a laser machining device and a laser lighting device.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. For example, those of skill in the art will recognize that a module may represent a circuit containing software for operating a means to achieve the purpose of the module, so that such phrases as module, means, and circuit will be understood by those of suitable skill in the art. Thus, it is intended that the present disclosure cover modifications and variations of this disclosure provided they come within the scope of the appended claims and their equivalents.

What is claimed is:

1. A laser machining device, to machine a machining target subject by irradiating the converged laser beam output from each laser diode of a plurality of laser diodes connected in series, comprising:
   a machining laser beam output-power driving circuit that outputs a machining laser beam by driving said plurality of laser diodes;
   a guide light output-power driving circuit that outputs a guide light by driving at least one partial laser diode of said plurality of laser diodes;
   a selection means to select said guide light output-power driving circuit on determining the position and to select said machining laser beam output-power driving circuit on laser machining; and
   a setup value comparison circuit to control an electric current to be below an electric current setup value to output the guide light, wherein the electric current flowing through said partial laser diode is not higher than a predetermined value.

2. The laser machining device, according to claim 1, further comprising:
   an excess electric current protection circuit that controls said electric current flowing through said at least one partial laser diode to be less than an upper limit of the electric current.

3. The laser machining device, according to claim 2, wherein:
   said machining laser beam output-power driving circuit further includes a first electric current control element connected in series to said plurality of laser diodes;
   said guide light output-power driving circuit further includes a second electric current control element connected in series to only said partial laser diode of said plurality of laser diodes; and
   said selection means further includes a first switch connected in series to said first electric current control element and a second switch connected in series to said second electric current control element.

4. The laser machining device, according to claim 2, wherein:
   said machining laser beam output-power driving circuit further includes the first electric current control element connected in series to said plurality of laser diodes;
   said guide light output-power driving circuit further includes a second electric current control element connected in series to only said partial laser diode of said plurality of laser diodes; and
   said selection means further includes a third switch that is connected to one end of each said one of said laser diodes and selects said guide light output-power driving circuit on determining a position and said machining laser output-power driving circuit on laser machining.

* * * * *